United States Patent
Kusunoki

(10) Patent No.: US 8,592,240 B2
(45) Date of Patent: Nov. 26, 2013

(54) METHOD FOR MANUFACTURING SEMICONDUCTOR LIGHT-EMITTING ELEMENT

(75) Inventor: Katsuki Kusunoki, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 302 days.

(21) Appl. No.: 13/121,478

(22) PCT Filed: Sep. 29, 2009

(86) PCT No.: PCT/JP2009/066955
§ 371 (c)(1),
(2), (4) Date: Mar. 29, 2011

(87) PCT Pub. No.: WO2010/038740
PCT Pub. Date: Apr. 8, 2010

(65) Prior Publication Data
US 2011/0177642 A1    Jul. 21, 2011

(30) Foreign Application Priority Data

Oct. 3, 2008  (JP) ................................. 2008-258855
Dec. 26, 2008 (JP) ................................. 2008-335020

(51) Int. Cl.
*H01L 21/00*  (2006.01)
(52) U.S. Cl.
USPC ............................................ 438/46; 438/479
(58) Field of Classification Search
USPC .......................................... 438/21, 46–47, 479
See application file for complete search history.

(56) References Cited

U.S. PATENT DOCUMENTS

| 5,237,182 | A  | * | 8/1993 | Kitagawa et al. ............... 257/15 |
| 6,509,579 | B2 |   | 1/2003 | Takeya et al. |
| 6,533,874 | B1 | * | 3/2003 | Vaudo et al. .................. 148/33.5 |
| 8,198,179 | B2 | * | 6/2012 | Sasaki et al. .................. 438/485 |
| 2001/0035534 | A1 | | 11/2001 | Takeya et al. |
| 2003/0045103 | A1 | | 3/2003 | Suzuki et al. |
| 2003/0183157 | A1 | | 10/2003 | Usui et al. |
| 2005/0191773 | A1 | | 9/2005 | Suzuki et al. |
| 2006/0191467 | A1 | | 8/2006 | Usui et al. |
| 2010/0065855 | A1 | | 3/2010 | Yokoyama et al. |
| 2011/0001163 | A1 | | 1/2011 | Sasaki et al. |

FOREIGN PATENT DOCUMENTS

| JP | 2001-196699 A | 7/2001 |
| JP | 2002-111058 A | 4/2002 |
| JP | 2003-063897   | 3/2003 |
| JP | 2003-165798 A | 6/2003 |
| JP | 2003-277195 A | 10/2003 |
| JP | 2004-168622 A | 6/2004 |
| JP | 2005-060195 A | 3/2005 |

(Continued)

*Primary Examiner* — Richard Booth
(74) *Attorney, Agent, or Firm* — Sughrue Mion, PLLC

(57) ABSTRACT

Provided is a method for manufacturing a semiconductor light-emitting element having a narrow wavelength distribution and comprising a substrate and a group III compound semiconductor layer formed thereon, the substrate being made of a material different from the compound semiconductor constituting the semiconductor layer. The method for manufacturing a semiconductor light-emitting element having a group III compound semiconductor layer is characterized by comprising a semiconductor layer-forming step wherein a group III compound semiconductor layer having a total thickness of not less than 8 μm is formed on a substrate (11) having a diameter D, a thickness and an amount of warpage H within the range of ±30 μm. The method is also characterized in that the diameter D and the thickness d of the substrate (11) satisfy the following formula (1):

$$0.7 \times 10^2 \leq (D/d) \leq 1.5 \times 10^2 \qquad (1).$$

14 Claims, 1 Drawing Sheet

(56) References Cited

FOREIGN PATENT DOCUMENTS

| | | |
|---|---|---|
| JP | 2006-156454 A | 6/2006 |
| JP | 2006-347776 A | 12/2006 |
| JP | 2007-088193 A | 4/2007 |
| JP | 2007-273814 | 10/2007 |
| JP | 2008-177525 A | 7/2008 |
| JP | 2008-205267 A | 9/2008 |
| KR | 10-2006-0112903 A | 11/2006 |
| WO | 2008/102646 A1 | 8/2008 |

* cited by examiner

METHOD FOR MANUFACTURING SEMICONDUCTOR LIGHT-EMITTING ELEMENT

TECHNICAL FIELD

The present invention relates to a method for manufacturing a semiconductor light-emitting element, and in particular to a method for manufacturing a semiconductor light-emitting element having a group III compound semiconductor layer.

BACKGROUND ART

In general, the semiconductor light-emitting element having a compound semiconductor layer such as a group III-V compound semiconductor layer is prepared as a light-emitting element chip by forming the compound semiconductor layer on a substrate made of a sapphire single crystal or the like, further providing an anode, a cathode and the like, grinding and polishing a surface-to-be-ground of the substrate, and thereafter cutting into an appropriate shape (refer to Patent Document 1).

CITATION LIST

Patent Literature

Patent Document 1: Japanese Patent Laid-Open Publication No. 2008-177525

SUMMARY OF INVENTION

Technical Problem

Incidentally, there is a problem that, when a substrate made of a material different from a compound semiconductor constituting a semiconductor layer is used and the semiconductor layer is formed on the substrate, a warpage occurs in the substrate due to a difference in a coefficient of thermal expansion between the substrate and the compound semiconductor.

If an amount of warpage of the substrate increases like this, a wavelength distribution a of the obtained semiconductor light-emitting element becomes large, thereby causing a problem of significantly increasing a rate of defective products. Such a phenomenon tends to be more pronounced as the diameter of the substrate increases.

Further, it is known that an internal stress is generated depending upon processing conditions in forming the semiconductor layer on the substrate, and thereby the substrate is more likely to suffer some warpage.

An object of the present invention is to provide a method for manufacturing a semiconductor light-emitting element including a step of, by use of a substrate made of a material different from that constituting a semiconductor layer, forming a group III compound semiconductor layer on the substrate, which enables to reduce a wavelength distribution a of an emission wavelength of the obtained semiconductor light-emitting element.

Solution to Problem

According to the present invention, there is provided a method for manufacturing a semiconductor light-emitting element having a group III compound semiconductor layer, the method including a semiconductor layer forming step to form the group III compound semiconductor layer having a total thickness of not less than 8 μm on a substrate having an amount of warpage H within a range of ±30 μm, a diameter D and a thickness d, wherein the diameter D and the thickness d of the substrate satisfy a relation of the following formula (1):

$$0.7 \times 10^2 \leq (D/d) \leq 1.5 \times 10^2 \tag{1}.$$

Here, in the method for manufacturing a semiconductor light-emitting element to which the present invention is applied, it is preferable that the group III compound semiconductor layer contains a group III nitride.

It is also preferable that the diameter D of the substrate is in a range of 50 mm to 155 mm, and the thickness d of the substrate is in a range of 0.4 mm to 1.5 mm.

Next, in the method for manufacturing a semiconductor light-emitting element to which the present invention is applied, it is preferable that the amount of warpage H of the substrate is selected from a range of $0 < H \leq 30$ μm and $-30$ μm $< H < 0$.

Further, it is preferable that the amount of warpage H of the substrate is selected from a range of $-10$ μm $< H < 0$.

Furthermore, it is preferable that, in a case where the diameter D of the substrate is 50 mm to 51 mm, the amount of warpage H of the substrate is selected from a range of $0 < H \leq 30$ μm and $-30$ μm $\leq H < 0$, whereas in a case where the diameter D of the substrate is 100 mm to 102 mm, the amount of warpage H of the substrate is selected from a range of $-10$ μm $< H < 0$.

Moreover, it is preferable that the substrate is made of a material different from a material of a group III compound semiconductor.

Further, it is preferable that the substrate is made of sapphire.

Next, in the method for manufacturing a semiconductor light-emitting element to which the present invention is applied, it is preferable to include an intermediate layer forming step to form an intermediate layer between the substrate and the group III compound semiconductor layer by a sputtering method.

It is also preferable that the group III compound semiconductor layer is formed by laminating a base layer, an n-type semiconductor layer, a light-emitting layer and a p-type semiconductor layer in this order on the substrate.

Further, it is preferable that the group III compound semiconductor layer is formed on the substrate by a metalorganic chemical vapor deposition method.

Next, according to the present invention, there is provided a method for manufacturing a semiconductor light-emitting element having a group III compound semiconductor layer, the method including a semiconductor layer forming step to form the group III compound semiconductor layer on a substrate having an amount of warpage H in a range of $-30$ μm $\leq H < 0$, a diameter D and a thickness d, wherein the diameter D and the thickness d of the substrate satisfy a relation of the following formula (1):

$$0.7 \times 10^2 \leq (D/d) \leq 1.5 \times 10^2 \tag{1}.$$

Here, in the method for manufacturing a semiconductor light-emitting element to which the present invention is applied, it is preferable that the group III compound semiconductor layer contains a group III nitride.

It is also preferable that the diameter D of the substrate is in a range of 50 mm to 155 mm, and the thickness d of the substrate is in a range of 0.4 mm to 1.5 mm.

Next, in the method for manufacturing a semiconductor light-emitting element to which the present invention is applied, it is preferable that the amount of warpage H of the substrate is selected from a range of $-10$ μm $< H < 0$.

Moreover, it is preferable that the substrate is made of a material different from a material of a group III compound semiconductor.

Further, it is preferable that the substrate is made of sapphire.

Next, in the method for manufacturing a semiconductor light-emitting element to which the present invention is applied, it is preferable to include an intermediate layer forming step to form an intermediate layer between the substrate and the group III compound semiconductor layer by a sputtering method.

It is also preferable that the group III compound semiconductor layer is formed by laminating a base layer, an n-type semiconductor layer, a light-emitting layer and a p-type semiconductor layer in this order on the substrate.

Further, it is preferable that the group III compound semiconductor layer is formed on the substrate by a metalorganic chemical vapor deposition method.

Advantageous Effects of Invention

According to the present invention, in the method for manufacturing a semiconductor light-emitting element, it is possible to manufacture a semiconductor wafer (semiconductor light-emitting element) without being affected by plural processes in the manufacturing steps, in which a standard deviation a (hereinafter, referred to as wavelength distribution in some cases: the unit thereof is nm) of the emission wavelength of the light-emitting layer in the same substrate is small by using a substrate having an amount of warpage H within a range of ±30 μm, a diameter D and a thickness d, where the relation between the diameter D and the thickness d satisfy the above-described formula (1) when the group III compound semiconductor layer is formed on the substrate which is made of a material different from a material of the semiconductor layer. Especially, according to the method for manufacturing the semiconductor light-emitting element of the present invention, it is possible to have the wavelength distribution a not more than 6 nm, and preferably not more than 5 nm.

DESCRIPTION OF EMBODIMENTS

Figure 1:
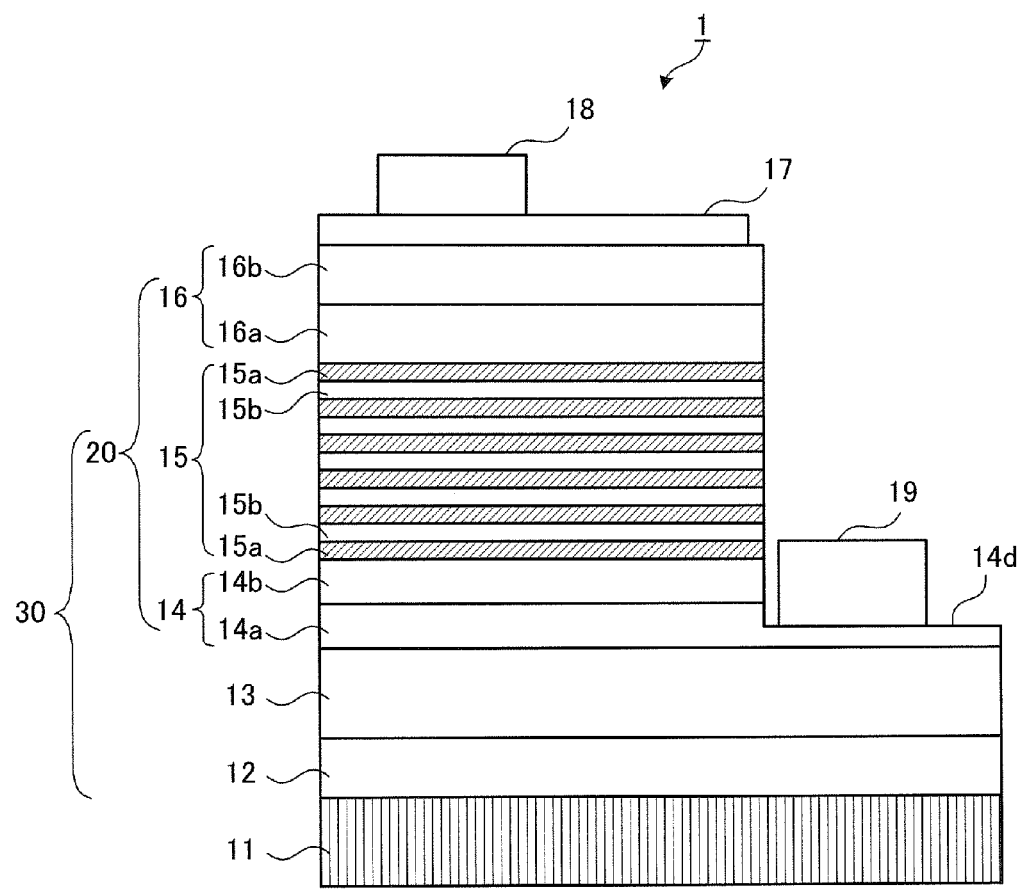
FIG. 1 is a diagram illustrating an example of a semiconductor light-emitting element manufactured in the exemplary embodiment.

An exemplary embodiment of the present invention will be described in detail below. It should be noted that the present invention is not limited to the exemplary embodiment below, but is able to be put into practice with various modifications within a scope of the gist thereof. Moreover, the drawing is used for the purpose of illustrating the exemplary embodiment, and does not intend to represent an actual size.
(Semiconductor Light-Emitting Element)

The semiconductor light-emitting element manufactured in the exemplary embodiment ordinarily includes a predetermined substrate and a compound semiconductor layer formed on the substrate. As a compound semiconductor constituting the compound semiconductor layer, for example, a group III-V compound semiconductor, a group II-VI compound semiconductor, a group IV-IV compound semiconductor and the like can be provided. In the exemplary embodiment, the group III-V compound semiconductor is preferred, and among others, a group III nitride compound semiconductor is more preferred. Description will be provided below to the semiconductor light-emitting element having the group III nitride compound semiconductor as an example.

FIG. 1 is a diagram illustrating an example of the semiconductor light-emitting element manufactured in the exemplary embodiment. As shown in FIG. 1, in a semiconductor light-emitting element 1, a base layer 13, an n-type semiconductor layer 14, a light-emitting layer 15 and a p-type semiconductor layer 16, which constitute a group III compound semiconductor layer 20, are laminated in this order on an intermediate layer 12 formed on a substrate 11.

Moreover, a transparent anode 17 is laminated on the p-type semiconductor layer 16, and an anode bonding pad 18 is formed thereon, and a cathode 19 is laminated on an exposed region 14d formed on an n-type contact layer 14a of the n-type semiconductor layer 14.

Here, the n-type semiconductor layer 14 formed on the base layer 13 constituted by the group III compound semiconductor includes the n-type contact layer 14a and an n-type cladding layer 14b. The light-emitting layer 15 has a structure in which barrier layers 15a and well layers 15b are alternately laminated. In the p-type semiconductor layer 16, a p-type cladding layer 16a and a p-type contact layer 16b are laminated.

In the exemplary embodiment, the thickness of a compound semiconductor layer 30 (a layer combining the intermediate layer 12, the base layer 13, and the group III compound semiconductor layer 20 together) is at least 8 μm or more, preferably 8.5 μm or more, and more preferably 9 μm or more. Further, the thickness of the compound semiconductor layer 30 is 15 μm or less, preferably 14 μm or less, and more preferably 13 μm or less.

If the thickness of the compound semiconductor layer 30 is excessively thin, especially, if the thickness of the base layer 13 and the n-type semiconductor layer 14 is thin, crystallinity of the light-emitting layer 15 and the p-type semiconductor layer 16, which are laminated thereafter, is deteriorated, thus causing a tendency to weaken light-emitting intensity when the semiconductor light-emitting element 1 is formed.
(Substrate 11)

The substrate 11 is made of a material different from a material of the group III nitride compound semiconductor, and group III nitride semiconductor crystals are epitaxially grown on the substrate 11. As the material constituting the substrate 11, for example, sapphire, carbonized silicon (silicon-carbide: SiC), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum and the like can be provided. Among these, sapphire and carbonized silicon (silicon-carbide: SiC) are particularly preferred.

Moreover, with respect to the surface of the substrate 11, it is preferable that there is a difference in the surface roughness Ra (arithmetic average roughness) between a surface on which the semiconductor layer is laminated (front surface) and a surface opposite thereto (back surface). Especially, it is more preferable to use a substrate with a relation of the surface roughness Ra in which front surface≤back surface.
(Intermediate layer 12)

As described above, in the exemplary embodiment, the substrate 11 is made of a material different from a material of the group III nitride compound semiconductor. Accordingly, when the group III compound semiconductor layer 20 is formed by a metalorganic chemical vapor deposition method (MOCVD) as described later, it is preferable to provide the intermediate layer 12 that performs a buffering function on the substrate 11. Especially, in terms of the buffering function, it is preferable that the intermediate layer 12 has a single crystal structure. In the case where the intermediate layer 12 having the single crystal structure is formed on the substrate 11, the buffering function of the intermediate layer 12 effectively works, and the base layer 13 and the group III compound semiconductor layer 20 which are formed on the intermediate layer 12 become a crystal film having excellent orientation property and crystallinity.

The intermediate layer 12 preferably contains Al (aluminum), and in particular, preferably contains AlN (aluminum nitride) which is a group III nitride. As a material constituting the intermediate layer 12, there is no particular limitation on any group III nitride compound semiconductor as long as it is denoted by the general formula of Al GaInN. Further, As or P may be contained as a group V element. In the case where the intermediate layer 12 is made of a composition containing Al, GaAlN is preferable, and the content of Al is preferably 50% or more.

As a material used for the base layer 13, the group III nitride containing Ga (GaN-based compound semiconductor) is used. In particular, AlGaN or GaN is preferable. The thickness of the base layer 13 is 0.1 μm or more, preferably 0.5 μm or more, and more preferably 1 μm or more.

(N-type semiconductor layer 14)

The n-type semiconductor layer 14 is constituted by the n-type contact layer 14a and the n-type cladding layer 14b. As the n-type contact layer 14a, similar to the base layer 13, GaN-based compound semiconductor is used. Further, the gallium nitride-based compound semiconductor which constitutes the base layer 13 and the n-type contact layer 14a have preferably the identical composition, and the total thickness of these layers is set in a range of 0.1 μm to 20 μm, preferably in a range of 0.5 μm to 15 μm, and more preferably in a range of 1 μm to 12 μm.

The n-type cladding layer 14b is formed by AlGN, GaN, GaInN, or the like. The hetero junction structure or the superlattice structure in which the layer is laminated plural times of these structures may also be used. When GaInN is employed, the band gap is preferably larger than that of GaInN of the well layer 15b constituting the light-emitting layer 15 which will be described later. The thickness of the n-type cladding layer 14b is preferably in a range of 5 nm to 500 nm, and more preferably in a range of 5 nm to 100 nm.

(Light-emitting Layer 15)

In the light-emitting layer 15, the barrier layers 15a made of gallium nitride-based compound semiconductor and the well layers 15b made of gallium nitride-based compound semiconductor containing indium are alternately laminated in a repeated manner. Further, the light-emitting layer 15 is formed by lamination so that the barrier layers 15a are provided to face the n-type semiconductor layer 14 and the p-type semiconductor layer 16, respectively. In the light-emitting layer 15 in the exemplary embodiment, six barrier layers 15a and five well layers 15b are alternately laminated in a repeated manner. Moreover, the barrier layers 15a are arranged as the uppermost and lowermost layers of the light-emitting layer 15. Further, the structure includes the well layers 15b arranged between the barrier layers 15a.

As the barrier layer 15a, it is preferable that a gallium nitride-based compound semiconductor, such as $Al_cGa_{1-c}N$ ($0 \leq c \leq 0.3$), which has a larger band gap energy than that of the well layer 15b made of the gallium nitride-based compound semiconductor containing indium, is used.

Moreover, for the well layer 15b, as the gallium nitride-based compound semiconductor containing indium, it is preferable to use a gallium indium nitride such as $Ga_{1-s}In_sN$ ($0<s<0.4$).

The thickness of the well layer 15b is not particularly limited; however, the thickness by which quantum effects can be obtained, that is, the critical thickness, is preferable. For example, the thickness of the well layer 15b is preferably in a range of 1 nm to 10 nm, and more preferably, in a range of 2 nm to 6 nm.

(P-type Semiconductor Layer 16)

The p-type semiconductor layer 16 is constituted by the p-type cladding layer 16a and the p-type contact layer 16b. As the p-type cladding layer 16a, $Al_dGa_{1-d}N$ ($0<d \leq 0.4$) is preferable. The thickness of the p-type cladding layer 16a is preferably in a range of 1 nm to 400 nm, and more preferably in a range of 5 nm to 100 nm.

As the p-type contact layer 16b, a gallium nitride-based compound semiconductor layer containing at least $Al_eGa_{1-e}N$ ($0 \leq e<0.5$) may be provided. The thickness of the p-type contact layer 16b is not particularly limited; however, it is preferably in a range of 10 nm to 500 nm, and more preferably in a range of 50 nm to 200 nm.

(Transparent Anode 17)

As the material constituting the transparent anode 17, conventionally-known materials such as ITO ($In_2O_3$-$SnO_2$), AZO (ZnO-$Al_2O_3$), IZO ($In_2O_3$-ZnO), and GZO (ZnO-$Ga_2O_3$) may be provided. Moreover, the structure of the transparent anode 17 is not particularly limited, and any conventionally-known structures can be employed. The transparent anode 17 may be formed to cover the almost entire surface of the p-type semiconductor layer 16 and may also be formed in a lattice shape or a tree shape.

(Anode Bonding Pad 18)

The anode bonding pad 18, which is an electrode formed on the transparent anode 17, is constituted by conventionally-known materials such as Au, Al, Ni and Cu. The structure of the anode bonding pad 18 is not particularly limited and conventionally-known structures may be employed.

The thickness of the anode bonding pad 18 is in a range of 100 nm to 1,000 nm, and preferably in a range of 300 nm to 500 nm.

(Cathode 19)

As shown in FIG. 1, in the group III compound semiconductor layer 20 (the n-type semiconductor layer 14, the light-emitting layer 15 and the p-type semiconductor layer 16) formed on the intermediate layer 12 and the base layer 13 which are formed on the substrate 11, the cathode 19 is formed to contact the n-type contact layer 14a in the n-type semiconductor layer 14. Therefore, when the cathode 19 is formed, a part of each of the p-type semiconductor layer 16, the light-emitting layer 15, and the n-type semiconductor layer 14 is removed, the exposed region 14d of the n-type contact layer 14a is formed, and then the cathode 19 is formed thereon.

The material and the structure of the cathode 19 may be employed from various conventionally-known materials and structures without any limitation. Further, the cathode 19 is provided on the exposed region 14d of the n-type contact layer 14a by any well-known method in this technical field.

(Method For Manufacturing Semiconductor Light-emitting Element)

In the exemplary embodiment, the semiconductor light-emitting element 1 is usually formed by forming the compound semiconductor layer 30 on the substrate 11 (a semiconductor layer forming step), then grinding the substrate 11 to a predetermined thickness, and thereafter cutting into an appropriate size.

First, on the substrate 11 made of sapphire having a predetermined diameter D and thickness d, the intermediate layer 12 made of group III nitride is formed by activating a metal material and gas containing a group V element with plasma, and reacting them. Subsequently, on the intermediate layer 12 thus formed, the base layer 13, the n-type semiconductor layer 14, the light-emitting layer 15 and the p-type conductor layer 16 are successively laminated.

In the exemplary embodiment, the diameter D of the substrate 11 used for forming the compound semiconductor layer 30 is usually selected from a range of 50 mm to 155 mm. Further, the thickness d of the substrate 11 is usually selected from a range of 0.4 mm to 1.5 mm, and preferably from a range of 0.4 mm to 1.2 mm.

On this occasion, in the exemplary embodiment, the amount of warpage H of the substrate 11 to be used is selected from a range of ±30 µm. Moreover, it is preferable to select the amount of warpage H of the substrate 11 from a range of 0<H≤30 µm and a range of −30 µm≤H<0. Further, it is more preferable to select the amount of warpage H of the substrate 11 from a range of −10 µm<H≤0.

In the exemplary embodiment, if the substrate 11 having the amount of warpage H of less than 0 (H<0) is used, there is a tendency to improve the crystallinity of the base layer 13, the n-type semiconductor layer 14 or the like, which are epitaxially grown on the substrate 11. Accordingly, the emission wavelength a in the same substrate of the light-emitting layer 15, which is grown on the n-type semiconductor 14, is reduced, and thereby causing a tendency to improve a yield of the light-emitting element chips after being divided.

Moreover, in the exemplary embodiment, in the case where the diameter D of the substrate 11 is of the order of 50 mm to 51 mm (about 2 inches), it is preferable to select the amount of warpage H of the substrate 11 from a range of 0<H≤30 µm and a range of −30 µm≤H<0. Further, in the case where the diameter D of the substrate 11 is of the order of 100 mm to 102 mm (about 4 inches), it is preferable to select the amount of warpage H of the substrate 11 from a range of −10 µm<H<0.

Here, the amount of warpage H of the substrate 11 is defined as a SORI value measured by a laser grazing incidence interferometer (flatness tester) before forming the above-described compound semiconductor layer 30. The SORI value (abide by the SEMI standard: M1-0302) is a difference between maximum and minimum values from a reference plane (least squares plane) calculated from all measurement point data items in a measurement area in the case where the substrate 11 is non-absorptive. However, at this time, the SORT value is an absolute value; therefore a direction of warpage is determined from a bird's eye view or a BOW value. The BOW value is obtained by providing a starting point to a center of the diameter of the substrate which is non-absorptive, and putting a sign with respect to whether the starting point is higher or lower than the reference plane (least squares plane) on a location most distant from the starting point. In the case of being lower, a minus value is obtained. Consequently, in the case where the warpage direction of the substrate 11 is in a convex state, a plus value is obtained, and in the case of a concave state, a minus value is obtained.

Next, in the exemplary embodiment, the diameter D and the thickness d of the substrate 11 used for forming the compound semiconductor layer 30 satisfy the relation of the following formula (1):

$$0.7 \times 10^2 \leq (D/d) \leq 1.5 \times 10^2 \quad (1).$$

In the exemplary embodiment, a compound semiconductor wafer having a small wavelength distribution a of the emission wavelength can be manufactured without being affected from plural processes in the manufacturing step by selecting the substrate 11 in which the relation between the diameter D and the thickness d satisfies the above formula (1) when the compound semiconductor layer 30 is formed on the substrate 11 made of a material different from a material constituting the compound semiconductor layer 30. Here, the compound semiconductor wafer is obtained by forming the compound semiconductor layer 30 on the substrate 11.

Here, if the ratio between the diameter D of the substrate 11 used for forming the compound semiconductor layer 30 and the thickness d of the substrate 11 (D/d) is excessively small, the wavelength distribution σ of the emission wavelength has small variations and becomes stable, but an amount of raw material usage for the substrate 11 itself is increased, thus becoming a factor for increasing in cost of the substrate 11. Moreover, since an amount of grinding by the later-described grinding process of the substrate 11 is increased, there is a tendency to decrease throughput.

Further, if (D/d) is excessively large, the amount of warpage of the compound semiconductor wafer is increased; therefore the wavelength distribution σ of the emission wavelength becomes large and there is a tendency to reduce yields of the semiconductor light-emitting element 1. Besides, even though variations in the thickness d of the substrate 11 are within a thickness tolerance, the wavelength distribution σ of the emission wavelength varies, thereby making it difficult to stably manufacture the compound semiconductor wafers. Moreover, if the amount of warpage of the compound semiconductor wafer becomes large, factors for reducing yields, such as insufficient exposure in photoresist, robot transfer errors, unstabilization in measurement of electric properties by probes, and unstabilization of focusing in laser processing, are caused in the course of manufacturing the semiconductor light-emitting element 1. In this case, there may be a way to control the thickness tolerance of the substrate 11 to be narrow; however, manufacture of the substrate 11 becomes highly difficult, thus becoming a factor for increasing costs.

In the exemplary embodiment, when the group III nitride semiconductor crystal is epitaxially grown on the above-described substrate 11, it is preferable to form the intermediate layer 12 on the substrate 11 with a material which has been activated with plasma and reacted by use of a sputtering method (intermediate layer forming step). Here, the group V element is nitrogen, a ratio of nitrogen content in a gas when the intermediate layer 12 is formed is set in a range of 50% to 99% or less, and the intermediate layer 12 is formed as a monocrystal structure. Consequently, the intermediate layer 12 having excellent crystallinity is formed on the substrate 11 as an orientation film having a specific anisotropy in a short time. As a result, the group III nitride semiconductor having excellent crystallinity is efficiently grown on the intermediate layer 12.

In the exemplary embodiment, after forming the intermediate layer 12 by the sputtering method, it is preferable to successively form the base layer 13, the n-type semiconductor layer 14, the light-emitting layer 15 and the p-type semiconductor layer 16 thereon by the metalorganic chemical vapor deposition method (MOCVD).

In the MOCVD method, hydrogen ($H_2$) or nitrogen ($N_2$) is used as a carrier gas, trimethylgallium (TMG) or triethylgallium (TEG) is used as a source of Ga which is a group III raw material, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$) or the like is used as a source of N which is a group V raw material. As a dopant, for the n-type, monosilane ($SiH_4$) or disilane ($Si_2H_6$) can be used as a raw material of Si, and organic germanium compounds, such as germane gas ($GeH_4$), tetramethyl germanium ($(CH_3)_4Ge$), or tetraethyl germanium ($(C_2H_5)_4Ge$) can be used as a germanium raw material.

It should be noted that the gallium nitride-based compound semiconductor may have a structure containing the group III elements other than Al, Ga, and In. As necessary, dopant elements such as Ge, Si, Mg, Ca, Zn and Be may be contained. Furthermore, there are some cases where not only the elements which are intentionally added but also impurities which are inevitably contained depending on the layer-forming conditions and the like, or a very small quantity of impurities which are contained in a raw material and a material of a reactor are contained.

It should be noted that, in the compound semiconductor layer 30, it is allowed to form the base layer 13 by the MOCVD method, thereafter form each of the n-type contact layer 14a and the n-type cladding layer 14b by the sputtering method, form the light-emitting layer 15 thereon by the MOCVD method, and then form each of the p-type cladding layer 16a and the p-type contact layer 16b constituting the p-type semiconductor layer 16 by a reactive sputtering method.

After forming the intermediate layer 12, the base layer 13 and the compound semiconductor layer 30 on the substrate 11 having the above-described diameter D and thickness d, the transparent anode 17 is laminated on the p-type semiconductor layer 16 of the compound semiconductor layer 30, and the anode bonding pad 18 is formed thereon. The wafer is formed in which the cathode 19 is further provided on the exposed region 14d formed in the n-type contact layer 14a of the n-type semiconductor layer 14.

After that, the surface-to-be-ground of the substrate 11 is ground and polished to a predetermined thickness. In the exemplary embodiment, the substrate 11 of the wafer is ground by a grinding process for about 20 minutes, and the thickness of the substrate 11 is reduced, for example, from about 900 μm to about 120 μm. Further, in the exemplary embodiment, the substrate 11 is polished so that the thickness thereof is reduced from about 120 μm to about 80 μm by a polishing process for about 15 minutes subsequent to the grinding process.

Next, the wafer, in which the thickness of the substrate 11 has been adjusted, is cut into squares each of which is of 350 μm per side, thus forming the semiconductor light-emitting element 1 in which the intermediate layer 12, the base layer 13 and the compound semiconductor layer 30 are formed on the substrate 11.

EXAMPLES

Hereafter, the present invention will be described in further detail based on Examples. However, the present invention is not limited to the following Examples as long as long as a scope of the gist thereof is not exceeded.

Methods for evaluating the amount of warpage H of the sapphire substrate used in the Examples and the distribution of the emission wavelength (wavelength distribution σ) obtained from the compound semiconductor wafer are as follows.

(1) Amount of Warpage H of Sapphire Substrate

The amount of warpage H of the sapphire substrate was evaluated based on the SORI value measured by a laser grazing incidence interferometer (Flatness Tester FT-17 manufactured by NIDEK Co., Ltd.). The SORI value was measured in a state where the sapphire substrate was absorbed to a bow chuck of the flatness tester and was inclined by 8 degrees frontward from a vertical position. The range of the measurement excluded 1 mm from the outer periphery of the sapphire substrate (inside value 1 mm).

(2) Distribution of Emission Wavelength (Wavelength Distribution σ) Obtained from Compound Semiconductor Wafer The method for measuring the wavelength distribution a of the emission wavelength is not particularly limited, but it is preferable to measure by using a PL mapper (RPM-Σ manufactured by Accent Optical Technologies, Inc.)

Experimental Nos. 1 to 10

The compound semiconductor wafer was formed by using the substrate 11 made of sapphire and having the diameter D and the thickness d shown in Table 1. First, as shown in FIG. 1, the inter mediate layer 12 made of MN and having a thickness of 0.05 μm was formed on the substrate 11 by the sputtering method. The base layer 13 made of undoped GaN and having a thickness of 8 μm and the n-type contact layer 14a made of Si-doped GaN and having a thickness of 2 μm were formed thereon by the metalorganic chemical vapor deposition method (MOCVD) to form a wafer.

Moreover, on the n-type contact layer 14a thus formed, the n-type cladding layer 14b made of $In_{0.1}Ga_{0.9}N$ and having a thickness of 250 nm was formed by the MOCVD. Then the barrier layer 15a made of Si-doped GaN and having a thickness of 16 nm and the well layer 15b made of $In0.2Ga_{0.8}N$ and having a thickness of 2.5 nm were laminated five times on the n-type cladding layer 14b. Finally the barrier layer 15a was provided, thereby forming the light-emitting layer 15 having a multiple quantum well structure.

Subsequently, on the light-emitting layer 15, the p-type cladding layer 16a made of Mg-doped $Al_{0.07}Ga_{0.93}N$ and having a thickness of 10 nm and the p-type contact layer 16b made of Mg-doped GaN and having a thickness of 150 nm were formed in this order.

It should be noted that lamination of the gallium nitride-based compound semiconductor layers was performed by the MOCVD method under normal conditions that are well known in this technical field.

Thereafter, the wavelength distribution a was measured by the above-described PL mapper (RPM-Σ manufactured by Accent Optical Technologies, Inc.) and the results shown in Table 1 were obtained.

Next, on the p-type contact layer 16b made of GaN, the transparent anode 17 made of IZO and having a thickness of 250 nm was formed; after that, normal processes that are well known in this technical field were applied, such as forming a protection layer made of $SiO_2$ and the like, to manufacture the chip used for the light-emitting element.

TABLE 1

| No. | Sapphire substrate | | | | Semiconductor wafer |
| --- | --- | --- | --- | --- | --- |
| | Substrate diameter D (mm) | Substrate thickness d (mm) | D/d (×10⁻²) | Amount of warpage H (μm) | Wavelength distribution σ (nm) |
| Experimental No. 1 | 50.8 | 0.42 | 1.21 | −5.2 | 2.1 |
| Experimental No. 2 | 50.8 | 0.70 | 0.73 | −10.1 | 1.8 |
| Experimental No. 3 | 100 | 0.73 | 1.37 | −7.1 | 3.2 |
| Experimental No. 4 | 100 | 0.91 | 1.10 | −8.7 | 1.8 |
| Experimental No. 5 | 100 | 0.91 | 1.10 | −5.4 | 1.8 |
| Experimental No. 6 | 100 | 0.91 | 1.10 | 4.2 | 2.6 |
| Experimental No. 7 | 100 | 0.91 | 1.10 | 2.3 | 2.2 |
| Experimental No. 8 | 150 | 1.10 | 1.36 | −2.4 | 4.9 |
| Experimental No. 9 | 150 | 1.30 | 1.15 | −3.2 | 2.5 |
| Experimental No. 10 | 100 | 0.52 | 1.92 | −7.5 | Unmeasurable |

From the results shown in Table 1, it is learned that the compound semiconductor wafer (Experimental Nos. 1 to 9) that was prepared by using the substrate 11 whose diameter D and thickness d satisfy the relation expressed by the aforementioned formula (1) and whose amount of warpage H is within the range of ±30 μm, and by forming the compound semiconductor layer 30 having a total thickness of 8 μm or more (10 μm) on the substrate 11 shows a good numerical value of the wavelength distribution σ of the emission wavelength, which is 5 nm or less.

In this case, there is a tendency that the wavelength distribution σ of the emission wavelength is better in the case where the warpage shape of the substrate 11 having a substrate diameter D of 100 mm is the concave shape (Experimental Nos. 4 and 5) than in the case of the convex shape (Experimental Nos. 6 and 7).

Further, there is a tendency that the wavelength distribution a of the emission wavelength becomes better as the value of D/d is smaller. In particular, it is remarkable when the comparison is performed between the same diameters (comparison between Experimental Nos. 1 and 2, comparison between Experimental Nos. 3 and 4, and comparison between Experimental Nos. 8 and 9).

In Experimental No. 10, even though the amount of warpage H was in the range of ±30 μm, if the relation of formula (1) was not satisfied, the wavelength distribution of the semiconductor wafer varied too large to be measured.

Experimental Nos. 11 to 17

The chip for the light-emitting element was manufactured by using the substrate 11 made of sapphire and having the amount of warpage H, the diameter D and the thickness d shown in Table 2 and by operations similar to those of Experimental No. 1. Also, similar to Experimental No. 1, the wavelength distribution σ was measured by the PL mapper (RPM-Σ manufactured by Accent Optical Technologies, Inc.). The results are shown in Table 2.

TABLE 2

| No. | Sapphire substrate | | | | Semiconductor wafer |
| --- | --- | --- | --- | --- | --- |
| | Substrate diameter D (mm) | Substrate thickness d (mm) | D/d (×10⁻²) | Amount of warpage H (μm) | Wavelength distribution σ (nm) |
| Experimental No. 11 | 50.8 | 0.42 | 1.21 | −5.2 | 2.1 |
| Experimental No. 12 | 50.8 | 0.70 | 0.73 | −10.1 | 1.8 |
| Experimental No. 13 | 100 | 0.73 | 1.37 | −7.1 | 3.2 |
| Experimental No. 14 | 100 | 0.91 | 1.10 | −8.7 | 1.8 |
| Experimental No. 15 | 100 | 0.91 | 1.10 | −5.4 | 1.8 |
| Experimental No. 16 | 150 | 1.10 | 1.36 | −2.4 | 4.9 |
| Experimental No. 17 | 150 | 1.30 | 1.15 | −3.2 | 2.5 |

From the results shown in Table 2, it is learned that the compound semiconductor wafer (Experimental Nos. 11 to 17) that was prepared by using the substrate 11 whose diameter D and thickness d satisfy the relation expressed by the aforementioned formula (1) and whose amount of warpage H is within the range of −30 μm≤H<0, and by forming the compound semiconductor layer 30 having a total thickness of about 10 μm on the substrate 11 shows a good numerical value of the wavelength distribution of the emission wavelength, which is 5 nm or less.

Further, there is a tendency that the wavelength distribution a of the emission wavelength becomes better as the value of D/d is smaller (Experimental Nos. 12, 14, 15 and 17). In particular, it is remarkable when the comparison is performed between the same diameters (comparison between Experimental Nos. 11 and 12, comparison between Experimental Nos. 13, 14 and 15, and comparison between Experimental Nos. 16 and 17).

REFERENCE SIGNS LIST

1 Semiconductor light-emitting element
11 Substrate
12 Intermediate layer
13 Base layer
14 N-type semiconductor layer
15 Light-emitting layer 16 P-type semiconductor layer
17 Transparent anode
18 Anode bonding pad
19 Cathode
20 Group III compound semiconductor layer
30 Compound semiconductor layer

The invention claimed is:

1. A method for manufacturing a semiconductor light-emitting element having a group III compound semiconductor layer, the method comprising:
a semiconductor layer forming step to form the group III compound semiconductor layer having a total thickness selected from a range of 8 μm to 15 μm on a substrate having an amount of warpage H selected from a range of −7.1 μm≤H<0, a diameter D selected from a range of 50 mm to 155 mm and a thickness d selected from a range of 0.7 mm to 1.5 mm,
wherein the diameter D and the thickness d of the substrate satisfy a relation of the following formula (1):

$$0.7\times10^2 \leq (D/d) \leq 1.5\times10^2 \qquad (1).$$

2. The method for manufacturing a semiconductor light-emitting element according to claim 1, wherein the group III compound semiconductor layer contains a group III nitride.

3. The method for manufacturing a semiconductor light-emitting element according to claim 1, wherein the substrate is made of a material different from a material of a group III compound semiconductor.

4. The method for manufacturing a semiconductor light-emitting element according to claim 1, wherein the substrate is made of sapphire.

5. The method for manufacturing a semiconductor light-emitting element according to claim 1, further comprising an intermediate layer forming step to form an intermediate layer between the substrate and the group III compound semiconductor layer by a sputtering method.

6. The method for manufacturing a semiconductor light-emitting element according to claim 1, wherein the group III compound semiconductor layer is formed by laminating a base layer, an n-type semiconductor layer, a light-emitting layer and a p-type semiconductor layer in this order on the substrate.

7. The method for manufacturing a semiconductor light-emitting element according to claim 1, wherein the group III compound semiconductor layer is formed on the substrate by a metalorganic chemical vapor deposition method.

8. A method for manufacturing a semiconductor light-emitting element having a group III compound semiconductor layer, the method comprising:
a semiconductor layer forming step to form the group III compound semiconductor layer on a substrate having an amount of warpage H in a range of −30 μm≤H<0, a diameter D selected from a range of 50 mm to 155 mm and a thickness d selected from a range of 0.7 mm to 1.5 mm,
wherein, in a case where the diameter D of the substrate is 50 mm to 51 mm, the amount of warpage H of the substrate is selected from a range of 0<H≤30 μm and −30 μm≤H<0, whereas in a case where the diameter D of the substrate is 100 mm to 102 mm, the amount of warpage H of the substrate is selected from a range of −10 μm<H<0,
wherein the diameter D and the thickness d of the substrate satisfy a relation of the following formula (1):

$$0.7\times10^2 \leq (D/d) \leq 1.5\times10^2 \qquad (1).$$

9. The method for manufacturing a semiconductor light-emitting element according to claim 8, wherein the group III compound semiconductor layer contains a group III nitride.

10. The method for manufacturing a semiconductor light-emitting element according to claim 8, wherein the substrate is made of a material different from a material of a group III compound semiconductor.

11. The method for manufacturing a semiconductor light-emitting element according to claim 8, wherein the substrate is made of sapphire.

12. The method for manufacturing a semiconductor light-emitting element according to claim 8, further comprising an intermediate layer forming step to form an intermediate layer between the substrate and the group III compound semiconductor layer by a sputtering method.

13. The method for manufacturing a semiconductor light-emitting element according to claim 8, wherein the group III compound semiconductor layer is formed by laminating a base layer, an n-type semiconductor layer, a light-emitting layer and a p-type semiconductor layer in this order on the substrate.

14. The method for manufacturing a semiconductor light-emitting element according to claim 8, wherein the group III compound semiconductor layer is formed on the substrate by a metalorganic chemical vapor deposition method.

* * * * *